(12) United States Patent
Aikawa et al.

(10) Patent No.: US 7,841,064 B2
(45) Date of Patent: Nov. 30, 2010

(54) METHOD OF MANUFACTURING AN ACOUSTIC WAVE DEVICE

(75) Inventors: Shunichi Aikawa, Yokohama (JP); Takumi Kooriike, Yokohama (JP); Jyouji Kimura, Yokohama (JP); Keiji Tsuda, Yokohama (JP); Masayuki Kitajima, Yokohama (JP); Kazunori Inoue, Kawasaki (JP); Takashi Matsuda, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 192 days.

(21) Appl. No.: 11/987,173

(22) Filed: Nov. 28, 2007

(65) Prior Publication Data
US 2008/0125662 A1    May 29, 2008

(30) Foreign Application Priority Data
Nov. 28, 2006  (JP) ............................. 2006-320891

(51) Int. Cl.
*H04R 31/00* (2006.01)
(52) U.S. Cl. .................... 29/594; 29/25.35; 29/595; 29/609.1; 205/199; 205/122; 310/366; 310/320; 310/344; 333/150; 333/187; 333/193; 333/195; 333/196
(58) Field of Classification Search ............... 29/25.35, 29/417, 594, 595, 609.1; 205/119, 122; 310/313, 310/320, 344, 366; 333/150, 187, 193, 195, 333/196
See application file for complete search history.

(56) References Cited

U.S. PATENT DOCUMENTS

| 6,703,768 | B2 * | 3/2004 | Kageyama et al. ........... 310/344 |
| 7,259,500 | B2 * | 8/2007 | Iwamoto et al. ............. 310/340 |
| 2002/0056897 | A1 | 5/2002 | Yatsuda |
| 2004/0251777 | A1 * | 12/2004 | Yamamoto et al. ....... 310/313 R |
| 2006/0192462 | A1 | 8/2006 | Iwamoto et al. |

FOREIGN PATENT DOCUMENTS

| JP | 9-232900 A | 9/1997 |
| JP | 2002-261582 A | 9/2002 |
| JP | 2003-37471 A | 2/2003 |

* cited by examiner

*Primary Examiner*—Paul D Kim
(74) *Attorney, Agent, or Firm*—Arent Fox LLP

(57) ABSTRACT

A method of manufacturing an acoustic wave device includes forming a first sealing portion on a substrate having an acoustic wave element thereon so that a functional region, in which an acoustic wave oscillates, of the acoustic wave element acts as a first non-covered portion and a cutting region for individuating acts as a second non-covered portion, forming a second sealing portion on the first sealing portion so as to cover the first non-covered portion and the second non-covered portion, and cutting off the substrate and the second sealing portion so that the second non-covered portion is divided.

2 Claims, 9 Drawing Sheets

PRIOR ART

PRIOR ART

PRIOR ART

METHOD OF MANUFACTURING AN ACOUSTIC WAVE DEVICE

BACKGROUND OF THE INVENTION

1. Field of the Invention

The present invention relates to an acoustic wave device and a method of manufacturing the acoustic wave device, in particular, relates to an acoustic wave device that has a sealing portion having a hollow region above a functional region of an acoustic wave element and a method of manufacturing the acoustic wave device.

2. Description of the Related Art

An acoustic wave device is widely used as a signal filter of an electrical and electronic device using an electromagnetic wave. The acoustic wave device is used as a transmitting and receiving filter of a radio communication device such as a mobile phone or a frequency filter for visual such as a television or a videotape recorder. In the acoustic wave device, a chip such as an acoustic wave element is sealed with a sealing portion made of a resin or the like. A surface acoustic wave element is one type of an acoustic wave device, and has a structure in which an electrode exciting a surface acoustic wave such as a comb electrode is provided on a piezoelectric substrate made of $LiNbO_3$, $LiTaO_3$ or the like. It is necessary to form a space on the piezoelectric substrate and on the electrode, because the surface acoustic wave propagates on a surface of the piezoelectric substrate. It is necessary to seal the acoustic wave element in order to gain trust, because there is not provided a protective membrane on the piezoelectric substrate and on the electrode.

Japanese Patent Application Publication No. 9-232900, Japanese Patent Application Publication No. 2002-261582 and Japanese Patent Application Publication No. 2003-37471 disclose an art where a sealing portion is formed on a substrate having an acoustic wave element, and a Wafer Level Package (WLP) is formed, in order to reduce a cost of the acoustic wave device.

A description will be given of a method of manufacturing an acoustic wave device in accordance with a first conventional embodiment that does not have a first sealing portion 22 and a second sealing portion 24 in a cutting region. FIG. 1A through FIG. 2I illustrate a manufacturing method of the acoustic wave device in accordance with the first conventional embodiment. As shown in FIG. 1A, there is formed a comb electrode 12, a wiring 14 connected to the comb electrode 12, a metal pattern 18 in a cutting region 42 (for individuating a wafer) on a substrate 10. There is formed a protective membrane 20 on the substrate 10, the comb electrode 12 and the wiring 14. A given region of the protective membrane 20 is removed. A barrier layer 16 is formed on the wiring 14 in a penetration region 44 (a region where a penetrating electrode is to be formed). As shown in FIG. 1B, the first sealing portion 22 is formed so that a functional region 40 (a region where an acoustic wave oscillates), the cutting region 42 and the penetration region 44 (a region where a penetrating electrode is to be formed) act as a first non-covered portion 50, a second non-covered portion 52 and a third non-covered portion 54 (portions not covered with a sealing resin) respectively.

As shown in FIG. 1C, a photosensitive resin film is adhered onto the first sealing portion 22, and the second sealing portion 24 is formed. As shown in FIG. 1D, ultraviolet (UV) ray is radiated to the second sealing portion 24 with use of a mask 32. As shown in FIG. 1E, a region of the second sealing portion 24 to which the ultraviolet (UV) ray is radiated is left after a development. And the second non-covered portion 52, the third non-covered portion 54 and a cavity 60 are formed.

As shown in FIG. 2F, a penetrating electrode 28 is formed in the third non-covered portion 54. As shown in FIG. 2G, a solder ball 30 is formed on the penetrating electrode 28. As shown in FIG. 2H, a blade 36 cuts off the substrate 10 along the cutting region 42. As shown in FIG. 2I, the acoustic wave device in accordance with the first conventional embodiment is manufactured.

Next, a description will be given of a method of manufacturing an acoustic wave device in accordance with a second conventional embodiment in which the first sealing portion 22 and the second sealing portion 24 are formed in the cutting region 42. FIG. 3A through FIG. 4H illustrate a method of manufacturing the acoustic wave device in accordance with the second conventional embodiment. As shown in FIG. 3A, the first sealing portion 22 is formed so that the functional region 40 and the penetration region 44 act as the first non-covered portion 50 and the third non-covered portion 54 respectively. The first sealing portion 22 is left in the cutting region 42, being different from the first conventional embodiment shown in FIG. 1B.

As shown in FIG. 3B, a photosensitive film is adhered onto the first sealing portion 22, and the second sealing portion 24 is formed. As shown in FIG. 3C, an ultraviolet (UV) ray is radiated to the second sealing portion 24 with use of the mask 32. As shown in FIG. 3D, a region of the second sealing portion 24 to which the ultraviolet (UV) ray is radiated is left after a development. And the third non-covered portion 54 and the cavity 60 are formed. The second sealing portion 24 is left in the cutting region 42, being different from the first conventional embodiment shown in FIG. 1E.

As shown in FIG. 4E, the penetrating electrode 28 is formed in the third non-covered portion 54. As shown in FIG. 4F, the solder ball 30 is formed on the penetrating electrode 28. As shown in FIG. 4G, the blade 36 cuts off the substrate 10, the first sealing portion 22 and the second sealing portion 24 along the cutting region 42. As shown in FIG. 4H, the acoustic wave device in accordance with the second conventional embodiment is thus manufactured.

In accordance with the first conventional embodiment and the second conventional embodiment, the first sealing portion 22 has a hollow region above the functional region 40, and the second sealing portion 24 covers the hollow region. Thus, the acoustic wave element is sealed. The solder ball 30 is connected to the acoustic wave element via the penetrating electrode 28. The acoustic wave element is flip-chip mounted with the solder ball 30. Thus, an electrical signal of the acoustic wave element is output to outside.

In the first conventional embodiment, a cutting load is small when a wafer is cut into a chip, because the first sealing portion 22 and the second sealing portion 24 in the cutting region 42 are removed as shown in FIG. 2H. However, there is a case where a foreign particle is adhered to the cutting region 42 in a process between sealing the substrate 10 shown in FIG. 1E and cutting the substrate shown in FIG. 2H, if the sealing portion is not provided on the cutting region 42. For example, a metal used for the penetrating electrode 28 in FIG. 2F and a solder used for the solder ball 30 in FIG. 2G drop into the second non-covered portion 52 in the cutting region 42. The chip size may be enlarged if an interval is enlarged between the cutting region 42 and the penetrating electrode 28 in order to solve the problem.

On the other hand, in the second conventional embodiment, a metal, a solder or the like does not drop into the cutting region 42 when the penetrating electrode 28 and the solder ball 30 are formed as shown in FIG. 4E and FIG. 4F, in a case where the first sealing portion 22 and the second sealing portion 24 are left in the cutting region 42 as shown in FIG. 3A through FIG. 4E. However, the wafer is warped because of a contraction pressure of the first sealing portion 22 and the second sealing portion 24 in a heating process of hardening the first sealing portion 22 and the second sealing portion 24 or in a reflow process of the solder.

SUMMARY OF THE INVENTION

The present invention has been made in view of the above circumstances and restrains an adherence of a foreign particle to a cutting region and a warp of a wafer in process of manufacture.

According to an aspect of the present invention, there is provided a method of manufacturing an acoustic wave device including forming a first sealing portion on a substrate having an acoustic wave element thereon so that a functional region, in which an acoustic wave oscillates, of the acoustic wave element acts as a first non-covered portion and a cutting region for individuating acts as a second non-covered portion, forming a second sealing portion on the first sealing portion so as to cover the first non-covered portion and the second non-covered portion, and cutting off the substrate and the second sealing portion so that the second non-covered portion is divided.

With the method, it is possible to restrain an adherence of a foreign particle to the cutting region in the manufacturing process, because the second sealing portion covers the cutting region in the manufacturing process. And it is possible to restrain a warp of a wafer because the second non-covered portion in the cutting region reduces a stress.

According to another aspect of the present invention, there is provided a method of manufacturing an acoustic wave device including forming a first sealing portion on a substrate having an acoustic wave element thereon so that a functional region, in which an acoustic wave oscillates, of the acoustic wave element acts as a first non-covered portion, forming a second sealing portion on the first sealing portion so that the second sealing portion covers the first non-covered portion and a region on the first sealing portion in a cutting region for individuating acts as a second non-covered portion, forming a third sealing portion on the second sealing portion so as to cover the second non-covered portion, and cutting the substrate, the first sealing portion and the third sealing portion so that the second non-covered portion is divided.

With the method, it is possible to restrain an adherence of a foreign particle to the cutting region in the manufacturing process, because the third sealing portion covers the cutting region in the manufacturing process. And it is possible to restrain a warp of a wafer because the second non-covered portion in the cutting region reduces a stress.

According to another aspect of the present invention, there is provided an acoustic wave device including a substrate having an acoustic wave element thereon, a first sealing portion that is provided on the substrate so that a functional region, in which an acoustic wave oscillates, of the acoustic wave element acts as a first non-covered portion, and a second sealing portion that is provided on the first sealing portion so that the first non-covered portion has a hollow shape. A side face of the first sealing portion is inside of a side face of the substrate and the second sealing portion.

With the structure, it is possible to restrain an adherence of a foreign particle to a cutting region in a manufacturing process of the acoustic wave device, because the second sealing portion covers the cutting region in the manufacturing process. And it is possible to restrain a warp of a wafer because a non-covered portion in the cutting region reduces a stress.

According to another aspect of the present invention, there is provided an acoustic wave device including a substrate having an acoustic wave element thereon, a first sealing portion that is provided on the substrate so that a functional region, in which an acoustic wave oscillates, of the acoustic wave element acts as a first non-covered portion, a second sealing portion that is provided on the first sealing portion so that the first non-covered portion has a hollow shape, and a third sealing portion provided on the second sealing portion. A side face of the second sealing portion is inside of a side face of the substrate, the first sealing portion and the third sealing portion.

With the structure, it is possible to restrain an adherence of a foreign particle to a cutting region in a manufacturing process of the acoustic wave device, because the third sealing portion covers the cutting region in the manufacturing process. And it is possible to restrain a warp of a wafer because a non-covered portion in the cutting region reduces a stress.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

First Embodiment

Figure 1A:
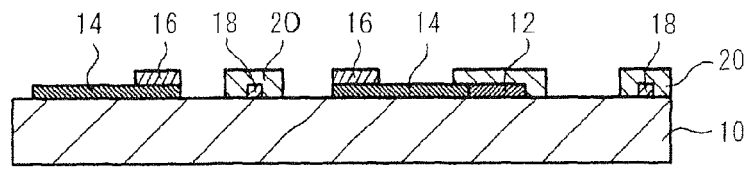
FIG. 1A through FIG. 1E illustrate a manufacturing process of an acoustic wave device in accordance with a first conventional embodiment.
Figure 1B:
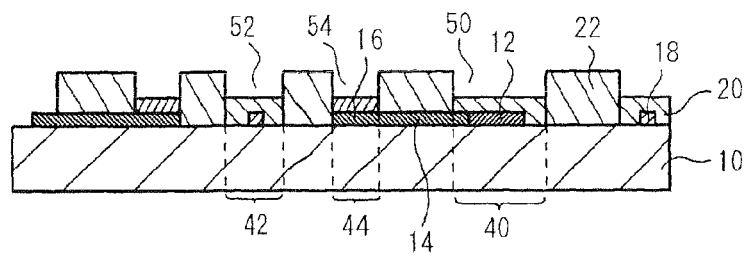
Figure 1C:
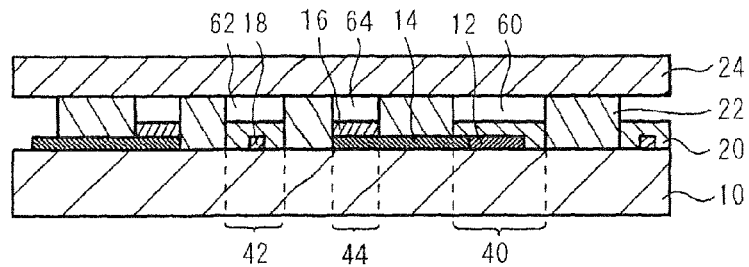
Figure 1D:
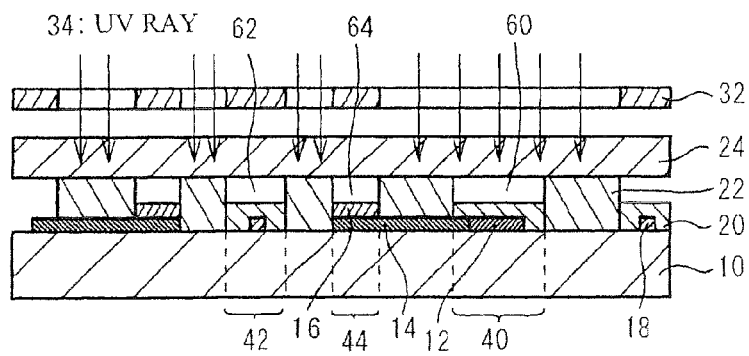
Figure 1E:
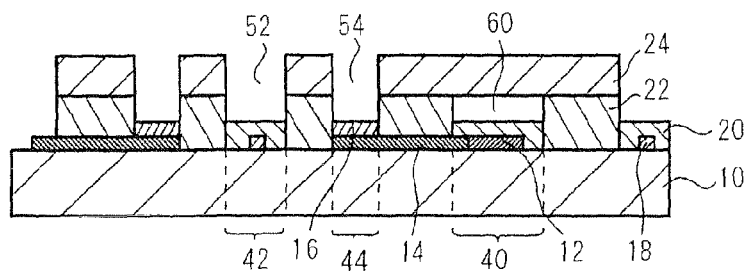
Figure 2F:
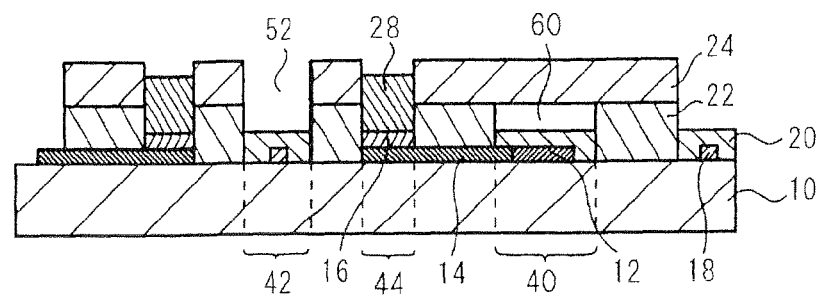
FIG. 2F through FIG. 2I illustrate the manufacturing process of the acoustic wave device in accordance with the first conventional embodiment.
Figure 2G:
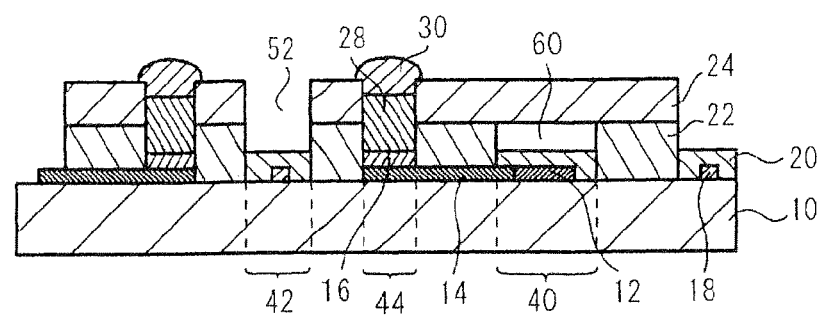
Figure 2H:
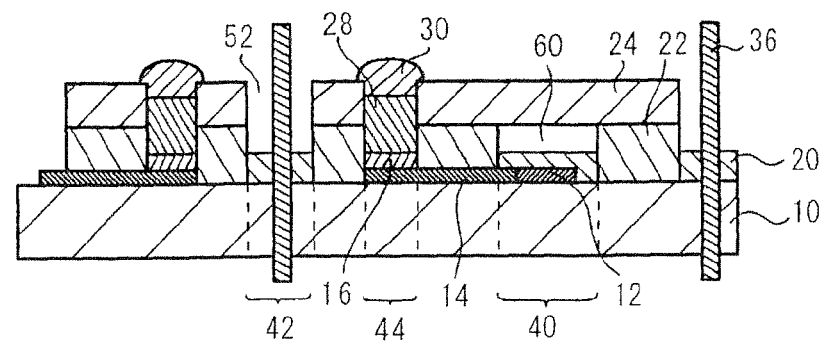
Figure 2I:
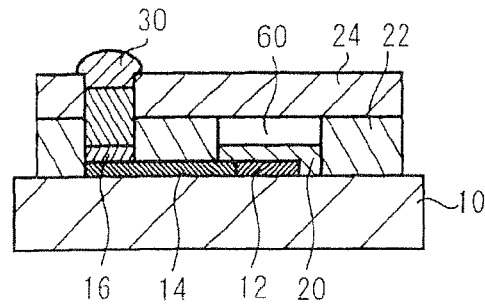
Figure 3A:
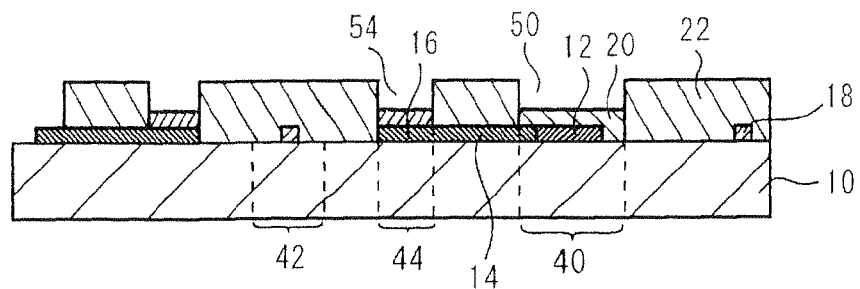
FIG. 3A through FIG. 3D illustrate a manufacturing process of an acoustic wave device in accordance with a second conventional embodiment.
Figure 3B:
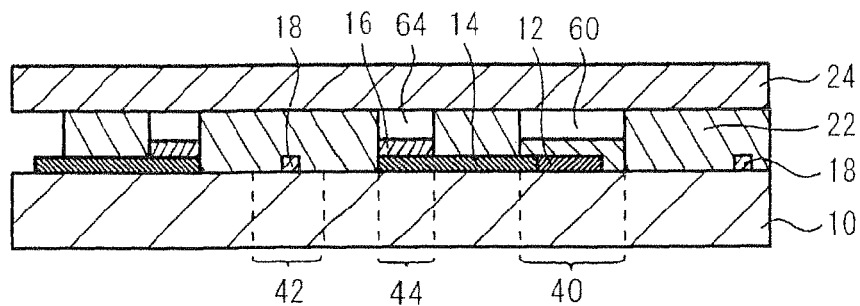
Figure 3C:
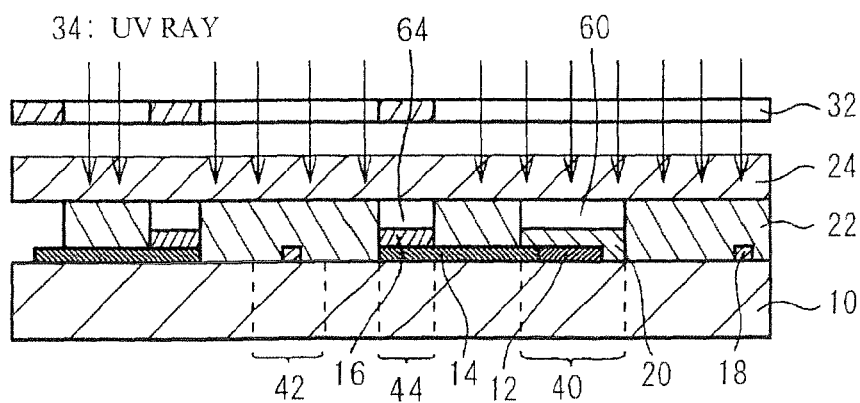
Figure 3D:
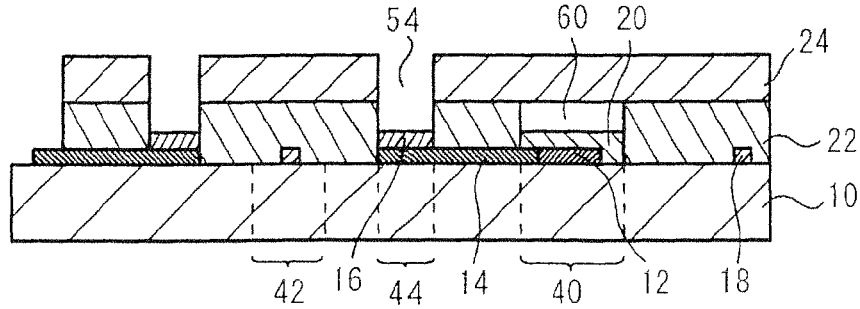
Figure 4E:
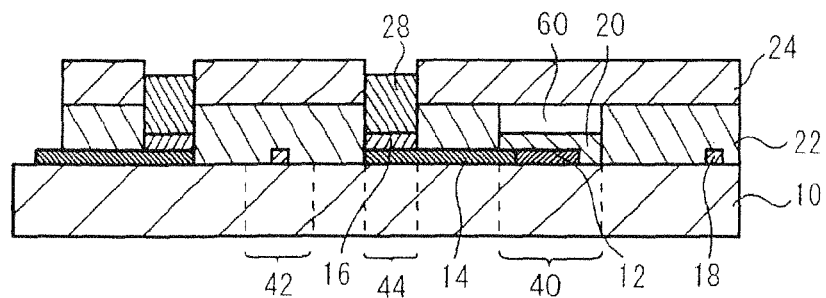
FIG. 4E through FIG. 4H illustrate the manufacturing process of the acoustic wave device in accordance with the second conventional embodiment.
Figure 4F:
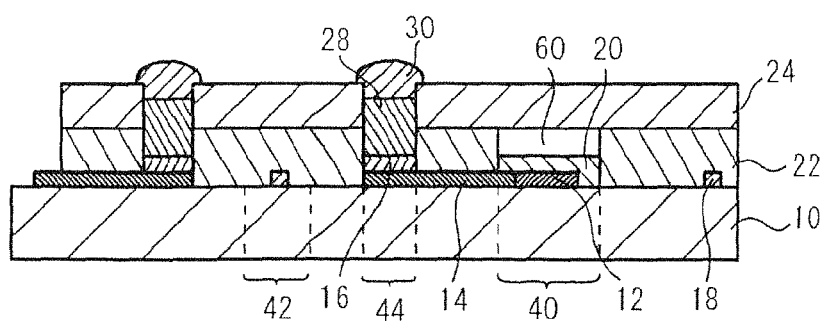
Figure 4G:
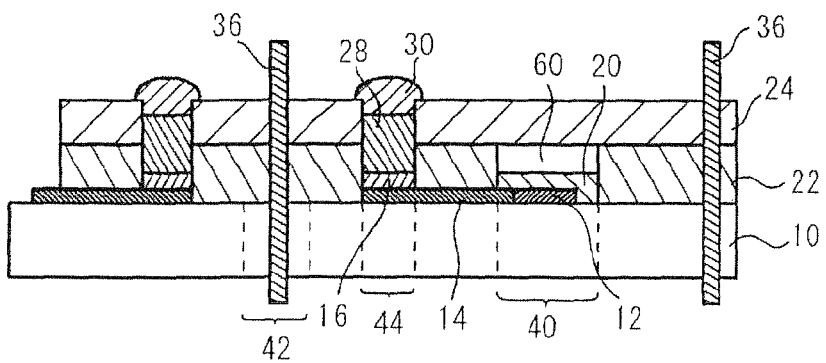
Figure 4H:
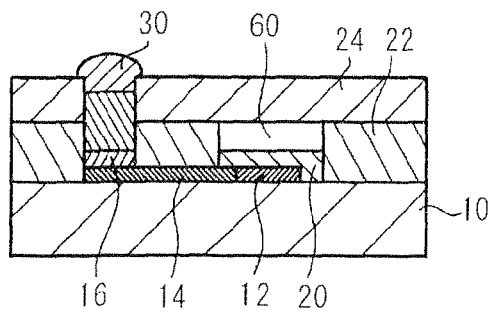
Figure 5A:
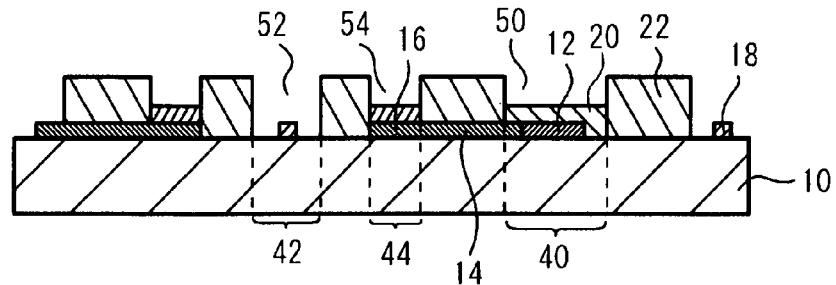
FIG. 5A through FIG. 5D illustrate a manufacturing process of an acoustic wave device in accordance with a first embodiment.

FIG. 5A through FIG. 6H illustrate a cross sectional view showing a manufacturing process of an acoustic wave device in accordance with a first embodiment. As shown in FIG. 5A, there are formed the comb electrode 12, the wiring 14 connected to the comb electrode 12, and the metal pattern 18 in the cutting region 42 on the piezoelectric substrate 10 made of LiTaO$_3$ (lithium tantalate), with Al (aluminum)-Cu (copper). The comb electrode 12 is an electrode exciting a surface acoustic wave of the piezoelectric substrate 10, and forms the acoustic wave element. The protective membrane 20 made of SiO$_2$ (silicon oxide) membrane is formed on the substrate 10, the comb electrode 12 and the wiring 14. A given region of the protective membrane 20 is removed. The barrier layer 16 made of Ti (titanium)/Au (gold) is formed on the wiring 14 in the penetration region 44 where a penetrating electrode is to be formed. A permanent negative resist made of an epoxy is spin-coated on the substrate 10 by 30 µm. The first sealing portion 22 in the functional region 40, in the cutting region 42 and in the penetration region 44 is removed after an exposure and a development. Thus, the first non-covered portion 50, the second non-covered portion 52 and the third non-covered portion 54 are formed. The first sealing portion 22 is formed so that the functional region 40 acts as the first non-covered portion 50, the cutting region 42 acts as the second non-covered portion 52, and the penetration region 44 acts as the third non-covered portion 54.

Figure 5B:
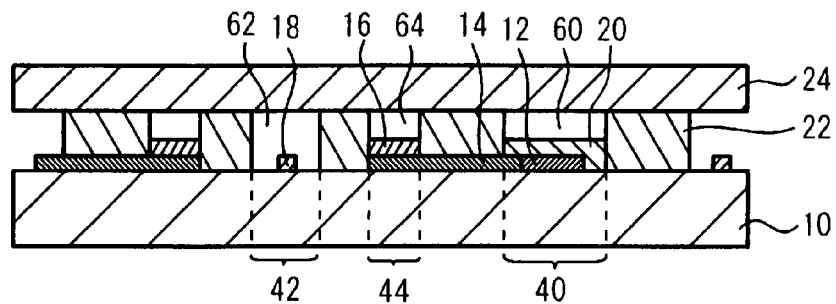
Figure 5C:
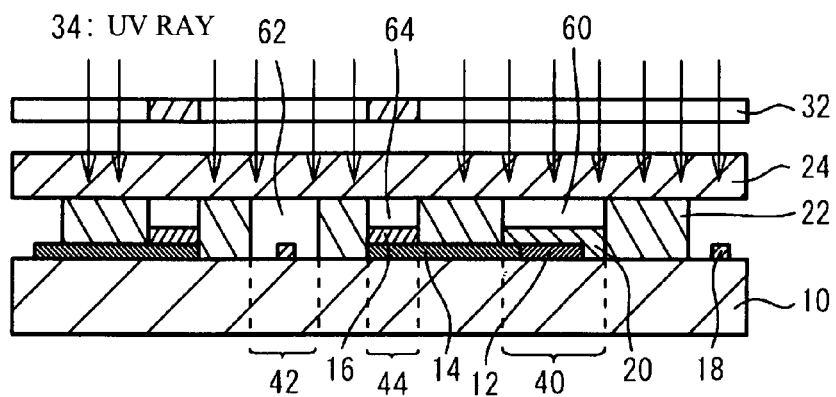
Figure 5D:
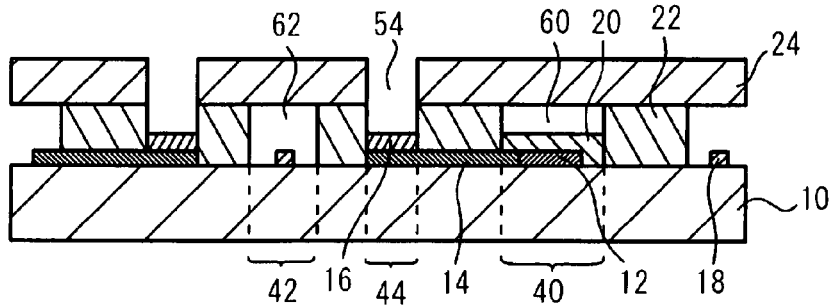

As shown in FIG. 5B, the epoxy permanent negative resist having a thickness of 30 µm and acting as the second sealing portion 24 is adhered onto the first sealing portion 22 with a tenting method. As shown in FIG. 5C, an ultra violet ray 34 is radiated to the second sealing portion 24 with use of the mask 32. As shown in FIG. 5D, the third non-covered portion 54 in the first sealing portion 22 and in the second sealing portion 24 is formed in the penetration region 44, and the cavity 60 and a cavity 62 covered with the second sealing portion 24 are formed on the functional region 40 and on the cutting region 42. A post bake is performed for an hour at a temperature of 250 degrees C. in order to thermally harden the second sealing portion 24. The post bake causes a warp of a 4 inches wafer by approximately 200 µm.

Figure 6E:
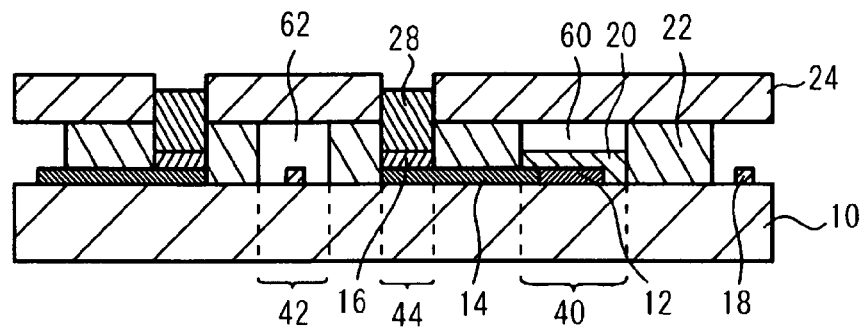
FIG. 6E through FIG. 6H illustrate the manufacturing process of the acoustic wave device in accordance with the first embodiment.
Figure 6F:
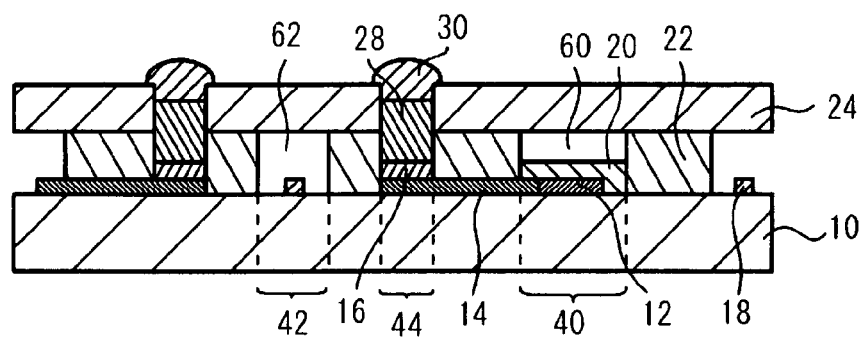

As shown in FIG. 6E, Ni (nickel) having a thickness of approximately 50 µm is formed in the third non-covered portion 54 with an electroplating. A surface of the Ni is subjected to a flash plating of Au (gold), and the penetrating electrode 28 made of the Ni is formed. As shown in FIG. 6F, SnAgCu (tin silver copper) solder paste is mask-printed and reflowed on the penetrating electrode 28, and the solder ball 30 is formed. The wafer warps by approximately 200 µm after the reflow process in which the solder ball 30 is formed. The warp of the wafer after the reflow is substantially the same as that before the reflow.

Figure 6G:
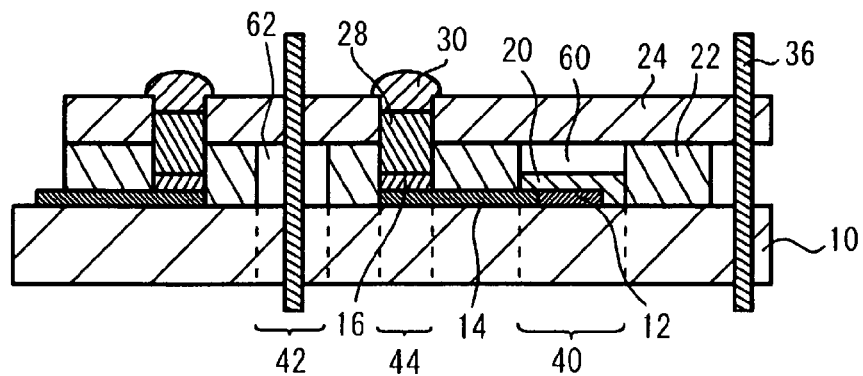
Figure 6H:
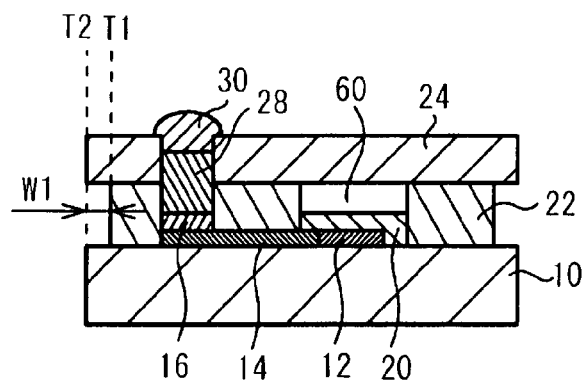

As shown in FIG. 6G, the blade 36 cuts off the second sealing portion 24 and the substrate 10 along the cutting region 42 with a dicing method. In this case, a peeling of the first sealing portion 22 and the second sealing portion 24 is not observed. With the processes, the acoustic wave device shown in FIG. 6H is manufactured. As shown in FIG. 6H, in the acoustic wave device, a side face T1 of the first sealing portion 22 is inside of a side face T2 of the substrate 10 and the second sealing portion 24. In the first embodiment, the cutting region 42 has a width of approximately 100 µm. And a distance W1 between the side face T1 and the side face T2 is approximately 5 µm to 10 µm.

In the manufacturing method in accordance with the first embodiment, the first sealing portion 22 is formed so that the functional region 40 acts as the first non-covered portion 50 and the cutting region 42 acts as the second non-covered portion 52 on the substrate 10 where the acoustic wave element is formed, as shown in FIG. 5A. As shown in FIG. 5D, the second sealing portion 24 is formed on the first sealing portion 22 so as to cover the first non-covered portion 50 and the second non-covered portion 52 and form the cavity 60. As shown in FIG. 6G, the substrate 10 and the second sealing portion 24 are cut off so that the second non-covered portion 52 is divided. With the processes, the cutting region 42 is covered with the second sealing portion 24 when the penetrating electrode 28 and the solder ball 30 are being formed, as shown in FIG. 6E and FIG. 6F. It is therefore possible to restrain the adherence of a foreign particle to the cutting region 42 as shown in the first conventional embodiment. It is possible to reduce the warp of the wafer, because a contraction pressure of the first sealing portion 22 and the second sealing portion 24 generated in the post bake shown in FIG. 5D or in the solder reflow process shown in FIG. 6F is reduced because of the cavity 62 in the cutting region 42.

As shown in FIG. 5A through FIG. 5G, the first sealing portion 22 and the second sealing portion 24 are formed so that the penetration region 44 acts as the third non-covered portion 54, in the process of forming the first sealing portion 22 and in the process of forming the second sealing portion 24. And, as shown in FIG. 6E, the penetrating electrode 28 is formed in the third non-covered portion 54 and is electrically connected to the acoustic wave element. It is therefore possible to form the penetrating electrode 28 that passes through the first sealing portion 22 and the second sealing portion 24 and is electrically connected to the acoustic wave element via the wiring 14. It is possible to obtain an electrical signal from an upper face of the second sealing portion 24. And it is possible to restrain the adherence of a foreign particle to the cutting region 42 when the penetrating electrode 28 is formed.

Second Embodiment

Figure 7A:
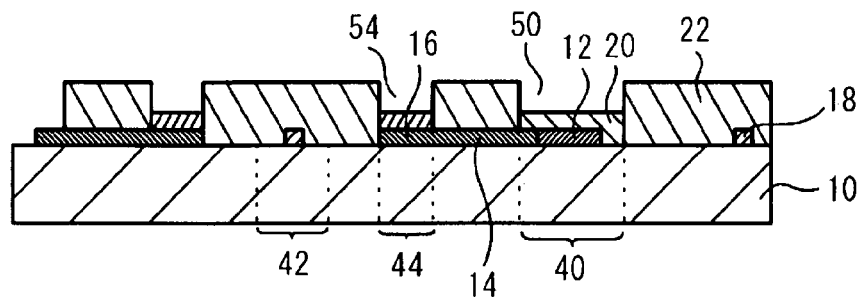
FIG. 7A through FIG. 7D illustrate a manufacturing process of an acoustic wave device in accordance with a second embodiment.

FIG. 7A through FIG. 9J illustrate a cross sectional view showing a manufacturing method of an acoustic wave device in accordance with a second embodiment. As shown in FIG. 7A, the first sealing portion 22 having a thickness of approximately 30 µm is formed on the substrate 10. The second non-covered portion is not formed in the cutting region 42, being different from the first embodiment shown in FIG. 5A. And the first sealing portion 22 is left. The other process is the same as that of the first embodiment shown in FIG. 5A.

Figure 7B:
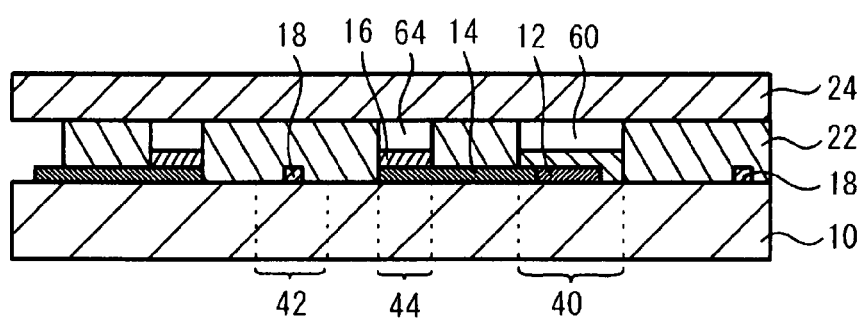
Figure 7C:
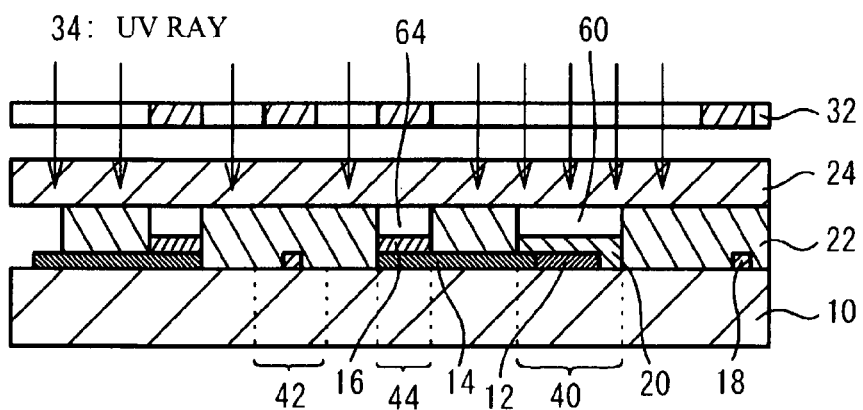
Figure 7D:
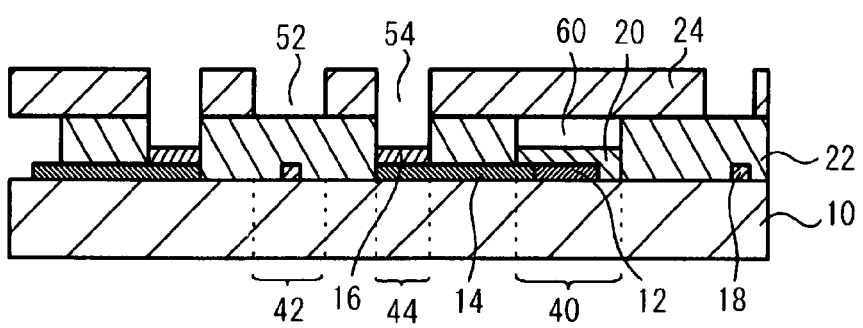

As shown in FIG. 7B, the second sealing portion 24 having a thickness of approximately 30 µm is formed on the first sealing portion 22. As shown in FIG. 7C, an ultra violet ray (UV ray) is radiated to the second sealing portion 24 with use of the mask 32. As shown in FIG. 7D, the second non-covered portion 52 and the third non-covered portion 54 are formed in the second sealing portion 24. The second non-covered portion 52 is formed in the cutting region 42, being different from the first embodiment shown in FIG. 5D. The other process is the same as the first embodiment shown in FIG. 5D.

Figure 8E:
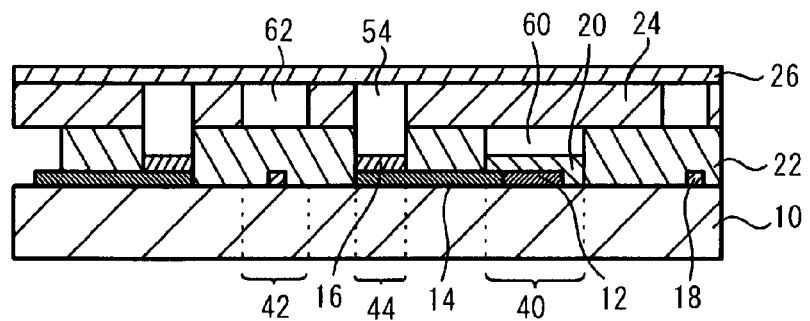
FIG. 8E through FIG. 8H illustrate the manufacturing process of the acoustic wave device in accordance with the second embodiment.
Figure 8F:
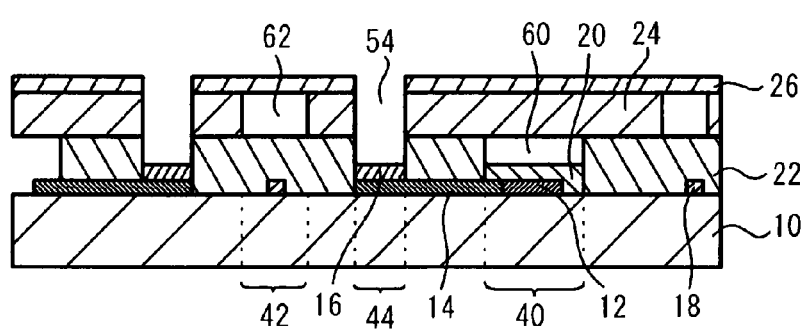

As shown in FIG. 8E, the epoxy permanent negative resist having a thickness of 30 µm and acting as a third sealing portion 26 is adhered onto the second sealing portion 24 with a tenting method. As shown in FIG. 8F, the third non-covered portion 54 in the first sealing portion 22, in the second sealing portion 24 and in the third sealing portion 26 are formed in the penetration region 44 after an exposure and a development. The cutting region 42 is covered with the third sealing portion 26. And the cavity 62 is formed.

Figure 8G:
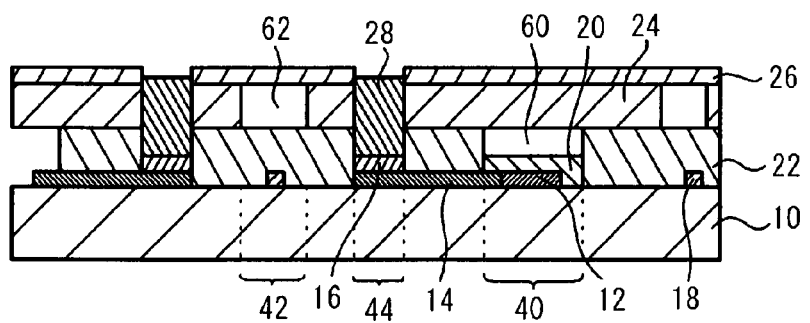
Figure 8H:
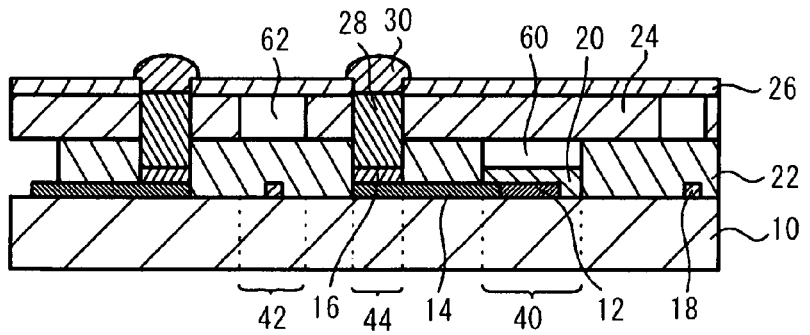

As shown in FIG. 8G, the penetrating electrode 28 is formed in the third non-covered portion 54, as is the case of the first embodiment shown in FIG. 6E. As shown in FIG. 8H, the solder ball is formed on the penetrating electrode 28, as is the case of the first embodiment shown in FIG. 6F.

Figure 9I:
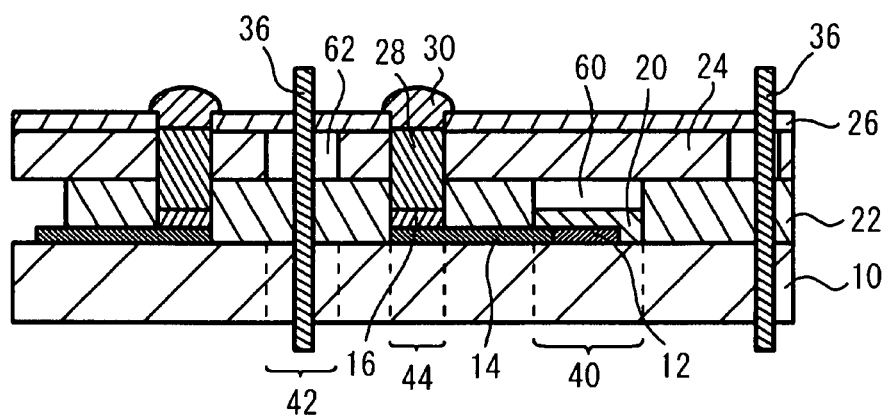
FIG. 9I and FIG. 9J illustrate the manufacturing process of the acoustic wave device in accordance with the second embodiment.
Figure 9J:
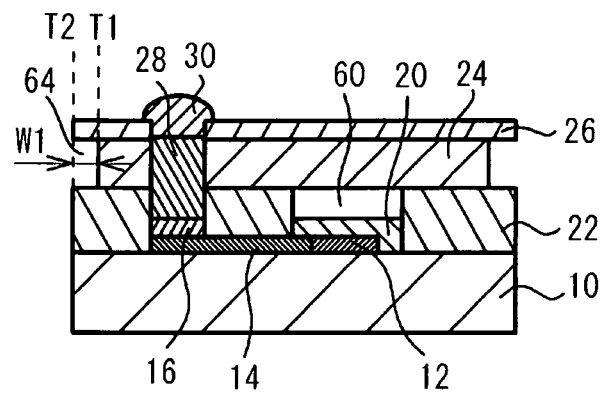

As shown in FIG. 9I, the blade 36 cuts off the third sealing portion 26, the first sealing portion 22 and the substrate 10 along the cutting region 42 with the dicing method, as is the case of the first embodiment shown in FIG. 6G. In this case, a peeling of the first sealing portion 22 and the second sealing portion 24 is not observed. As shown in FIG. 9J, in the acoustic wave device, the side face T1 of the second sealing portion 24 is inside of the side face T2 of the substrate 10, the first sealing portion 22 and the second sealing portion 24.

In the manufacturing method in accordance with the second embodiment, the first sealing portion 22 is formed so that the functional region 40 acts as the first non-covered portion 50, as shown in FIG. 7A. As shown in FIG. 7D, the second sealing portion 24 is formed on the first sealing portion 22 so that the second sealing portion 24 covers the first non-covered portion 50, a cavity is formed in the first non-covered portion 50, and a region of the cutting region 42 above the first sealing portion 22 acts as the second non-covered portion 52. As shown in FIG. 8F, the third sealing portion 26 is formed on the second sealing portion 24 so as to cover the second non-covered portion 52. As shown in FIG. 9I, the substrate 10, the first sealing portion 22 and the third sealing portion 26 are cut off so that the second non-covered portion 52 is divided. With the processes, the cutting region 42 is covered with the third sealing portion 26 when the penetrating electrode 28 and the solder ball 30 are being formed, as shown in FIG. 9G and FIG. 9H. It is therefore possible to restrain the adherence of a foreign particle to the cutting region 42 as shown in the first embodiment. It is possible to reduce the warp of the wafer, because a contraction pressure of the first sealing portion 22, the second sealing portion 24, and the third sealing portion 26 generated in the post bake shown in FIG. 7D and FIG. 8F or in the solder reflow process shown in FIG. 8H is reduced because of the cavity 62 in the cutting region 42.

As shown in FIG. 8F, in the second embodiment, the third sealing portion 26 is formed so that the penetration region 44 where the penetrating electrode is to be formed acts as the third non-covered portion 54, in addition to the process of forming the first sealing portion 22 and the second sealing portion 24 in accordance with the first embodiment. And as shown in FIG. 8G, the penetrating electrode 28 is formed in the third non-covered portion 54 and is electrically connected to the acoustic wave element. It is therefore possible to form the penetrating electrode 28 that passes through the first sealing portion 22 through the third sealing portion 26 and is electrically connected to the acoustic wave element via the wiring 14. It is possible to obtain an electrical signal from an upper face of the third sealing portion 26. And it is possible to restrain the adherence of a foreign particle to the cutting region 42 when the penetrating electrode 28 is formed.

In the first embodiment and the second embodiment, the photosensitive resin is formed when the first sealing portion 22 is formed, as shown in FIG. 5B and FIG. 7B. The first non-covered portion 50 is formed with the exposure shown in FIG. 5C and FIG. 7C. With the processes, it is possible to easily form the first non-covered portion 50 in the first sealing portion 22.

It is possible to form the photosensitive resin by coating the epoxy negative resist as shown in FIG. 5B and FIG. 7B. It is therefore possible to easily form the photosensitive resist acting as the first sealing portion 22.

It is possible to form a film-shaped photosensitive resin sheet on the first sealing portion 22 as shown in FIG. 5B and FIG. 7B, when the second sealing portion 24 is formed. It is therefore possible to cover the first non-covered portion 50 with the second sealing portion 24 with a resin not being adhered to the inside of the first non-covered portion 50. And it is possible to form the cavity 60.

FIG. 6E and FIG. 8G show the process of forming the Ni in the third non-covered portion 54 with the electroplating as a process of forming the penetrating electrode 28. The penetrating electrode 28 may be an electrically conductive material including at least one of Ag (silver), Cu (copper), SnAg (tin silver) and SnAgCu (tin silver copper). The penetrating electrode 28 may be formed with a method other than the electroplating, for example a printing process.

In accordance with the first embodiment and the second embodiment, it is possible to restrain the adherence of a foreign particle to the cutting region 42 when the solder call 30 is formed on the penetrating electrode 28 as shown in FIG. 6F and FIG. 8H. The solder ball 30 may be made of a solder such as a SnAg (tin silver) solder or a SnAgCu (tin silver copper) solder.

In the first embodiment and the second embodiment, the acoustic wave element has the substrate 10 made of $LiTaO_3$ (lithium tantalate). The acoustic wave element may have a piezoelectric substrate such as $LiNbO_3$ (lithium niobate) substrate. The acoustic wave element is not limited to the surface acoustic wave element. For example, it is necessary that a FBAR (Film bulk acoustic resonator) should have a cavity above a functional region where an acoustic wave oscillates. Therefore, the acoustic wave element may be the FBAR.

While the above description constitutes the preferred embodiments of the present invention, it will be appreciated that the invention is susceptible of modification, variation and change without departing from the proper scope and fair meaning of the accompanying claims.

The present application is based on Japanese Patent Application No. 2006-320891 filed on Nov. 28, 2006, the entire disclosure of which is hereby incorporated by reference.

What is claimed is:

1. A method of manufacturing an acoustic wave device comprising:

forming a first sealing portion on a substrate having an acoustic wave element thereon so that a functional region, in which an acoustic wave oscillates, of the acoustic wave element acts as a first non-covered portion in which the first sealing portion is not formed, and so that the first sealing portion is formed in a cutting region for individuating;

forming a second sealing portion on the first sealing portion so that the second sealing portion covers the first non-covered portion and a region on the first sealing portion in the cutting region for individuating acts as a second non-covered portion in which the second sealing portion is not formed;

forming a third sealing portion on the second sealing portion so as to cover the second non-covered portion; and cutting the substrate, the first sealing portion and the third sealing portion so that the second non-covered portion is divided.

2. A method of manufacturing an acoustic wave device comprising:

forming a first sealing portion on a substrate having an acoustic wave element thereon so that a functional resion in which an acoustic wave oscillates of the acoustic wave element acts as a first non-covered portion;

forming a second sealing portion on the first sealing portion so that the second sealing portion covers the first non-covered portion and a region on the first sealing portion in a cutting region for individuating acts as a second non-covered portion;

forming a third sealing portion on the second sealing portion so as to cover the second non-covered portion; and cutting the substrate, the first sealing portion and the third sealing portion so that the second non-covered portion is divided; wherein:

the step of forming the first sealing portion is a step of forming the first sealing portion so that a region where a penetrating electrode is to be formed acts as a third non-covered portion;

the step of forming the second sealing portion is a step of forming the second sealing portion so that the region where the penetrating electrode is to be formed acts as the third non-covered portion;

the step of forming the third sealing portion is a step of forming the third sealing portion so that the region where the penetrating electrode is to be formed acts as the third non-covered portion; and the method further includes forming the penetrating electrode in the third non-covered portion.

* * * * *